United States Patent [19]

Markow et al.

[11] Patent Number: 4,992,726
[45] Date of Patent: Feb. 12, 1991

[54] WOVEN CROSSED-COIL AIR-CORE GAUGE

[75] Inventors: Paul A. Markow, Huntsville; William Nolle, Hazel Green, both of Ala.

[73] Assignee: Acustar, Inc., Troy, Mich.

[21] Appl. No.: 431,356

[22] Filed: Oct. 27, 1989

[51] Int. Cl.⁵ .......................... G01R 1/20; H01F 27/30
[52] U.S. Cl. ..................................... 324/146; 336/188
[58] Field of Search .......... 324/144, 146, 147, 151 R, 324/154 R, 154 PB; 336/188, 191

[56] References Cited

U.S. PATENT DOCUMENTS

| | | | |
|---|---|---|---|
| 2,910,654 | 10/1959 | Wiegand | 336/188 |
| 3,460,038 | 8/1969 | Ziegler | 324/146 |
| 4,492,920 | 1/1985 | Reenstra | 324/146 |
| 4,633,174 | 12/1986 | Lindig et al. | 336/188 |
| 4,906,919 | 3/1990 | Sato et al. | 324/143 |

Primary Examiner—Reinhard J. Eisenzopf
Assistant Examiner—Maura K. Regan
Attorney, Agent, or Firm—Wendell K. Fredericks

[57] ABSTRACT

An air-core gauge containing interwoven cross-coil stator windings that permit interchanging the stator windings of equal radii and still achieve rotor meter movement that coincide directly with desired needle movement over a dial containing linear magnitude graduations.

8 Claims, 3 Drawing Sheets

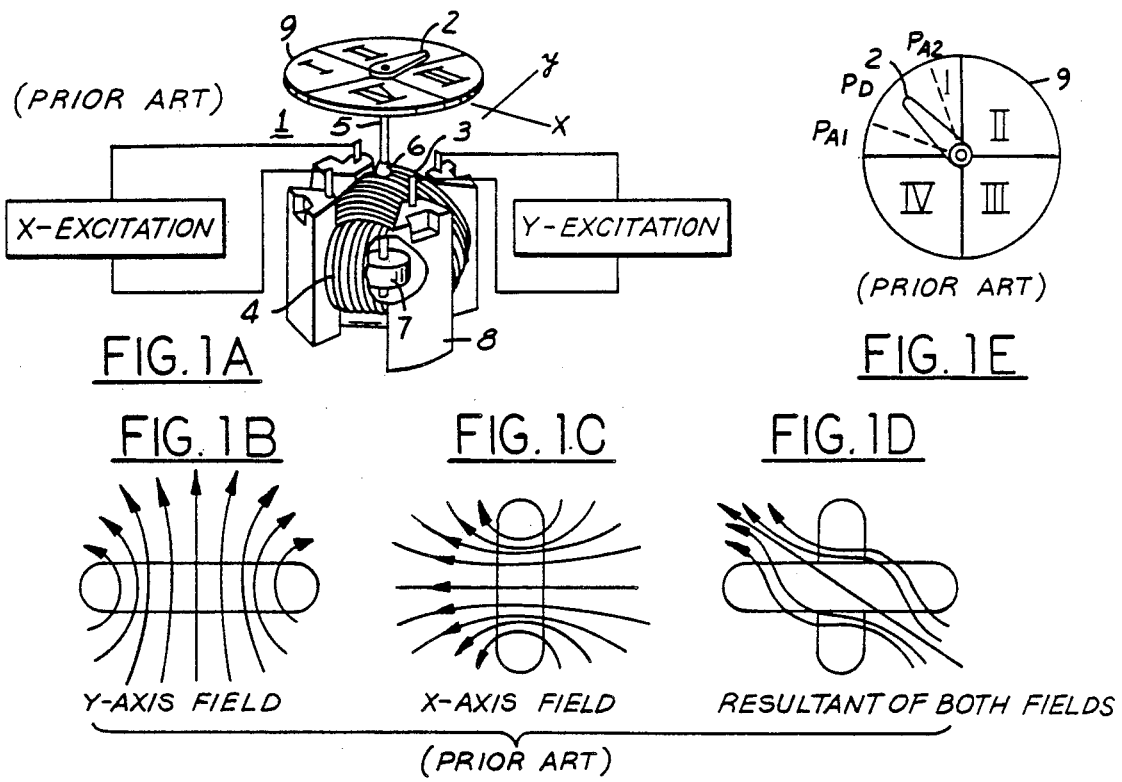
FIG. 1A (PRIOR ART)
FIG. 1E (PRIOR ART)
FIG. 1B  FIG. 1C  FIG. 1D
Y-AXIS FIELD   X-AXIS FIELD   RESULTANT OF BOTH FIELDS
(PRIOR ART)
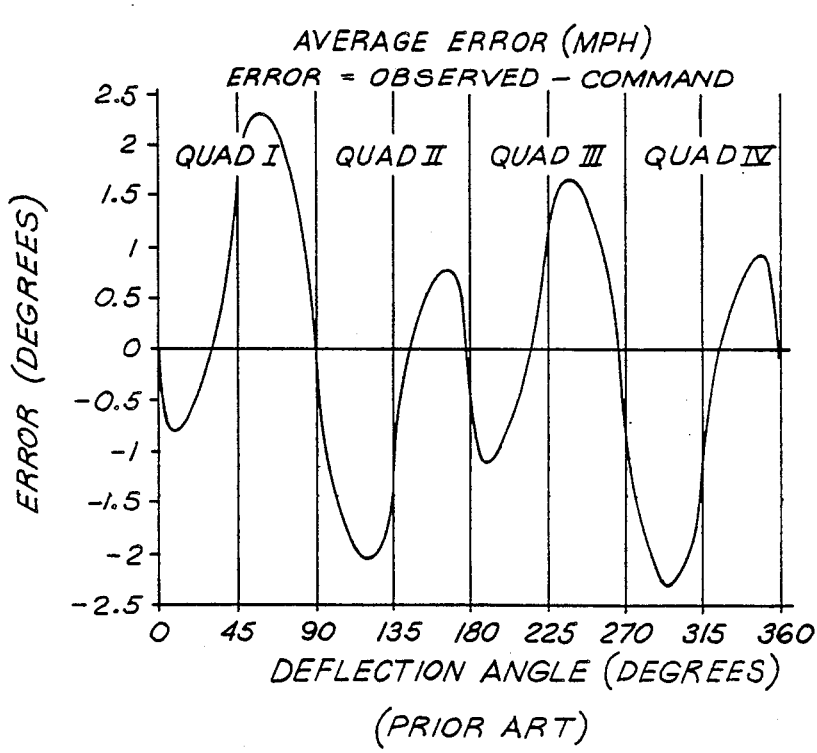
FIG. 1F (PRIOR ART)

Y-AXIS FIELD

X-AXIS FIELD
WOVEN COIL GAUGE

RESULTANT OF BOTH FIELDS

WOVEN CROSSED-COIL AIR-CORE GAUGE

BACKGROUND OF THE INVENTION

1. Field of the Invention

The present invention relates to electric analog indicators and, more particularly, to air-core gauge devices having orthogonally wound deflection coils.

2. Description of the Prior Art

In a conventional air-core gauge with normal orthogonally positioned electro-magnetic deflection coils wound about a non-metallic material bobbin, a problem exists in producing electro-magnetic fields of equal intensity in the orthogonally positioned deflection coils. Within a central region of a cavity of the bobbin, a magnetized rotor rotatably mounts in magnetic proximity to the deflection coils and attaches to an indicator needle which moves angularly over a series of linear graduations on a dial face to indicate changing conditions.

With one coil closer to the rotor than the other, the radii are different. If both coils had an equal number of windings, the coil closest to the rotor would produce a higher field intensity than the other if energized by equivalent current signals. Hence, various strategies exist to balance the effect of the individual fields. One approach includes providing one coil with fewer windings than the other. Another requires different size wire for the windings. Such approaches have provided some assistance in promoting linearity.

Such strategies have not only increased the cost of air-core gauges, but in some instances have increased the size of the device.

Also, in gauges where more than one quadrant of the indicator dial is used and the dial pointer moves from 0° to over 270°, i.e., when the dial graduations expand to permit reading beyond 90, 180 or even 270 degrees, a current signal reversal in both windings must occur in order for the pointer to cross over the interface between quadrants. If the size of wire of the windings or the number of the windings differ, the shape of the two individual magnetic fields will differ; hence, a sum of the two fields yields an unbalanced resultant field upon which the rotor aligns causing further inaccuracies in the instrument.

Realizing the above conditions exist, efforts were made toward devising resultant electro-magnetic fields from the deflection coil which eliminated the imbalance between the orthogonally positioned coils. That effect resulted in the present gauge device that contains structure that appears to depart from the prior art cross coil structure.

BRIEF SUMMARY OF THE INVENTION

The present invention is concerned with a novel construction of an air-core gauge which provides orthogonally positioned deflection coil comprised of uniform coil perimeters. Departing from the normal approach of winding individual coils, the present invention features weaving windings of cross coils to produce woven orthogonally positioned coils such that equal radii of the coils result and the rotor mounts in equal magnetic proximity to the orthogonally positioned coil.

BRIEF DESCRIPTION OF THE DRAWINGS

FIG. 1A is a perspective view of the prior art cross-coil air-core gauge;

FIGS. 1B and 1C depict the magnetic fields for the X coil and Y coil of FIG. 1A;

FIG. 1D depicts the resultant fields of the two field of FIGS. 1B and 1C;

FIG. 1E shows desired and actual positions of the dial pointer of the gauge of FIG. 1A due to the imbalance generated by the fields of the X and Y coils;

FIG. 1F depicts a plot of the average error in deflection of a chosen number of prior art air-core gauges;

FIGS. 4A and 4B depict the magnetic fields for the X and Y coils of FIG. 2 while

DETAILED DESCRIPTION OF A PREFERRED EMBODIMENT

The Prior Art Air Core Gauge

Figure 3B:
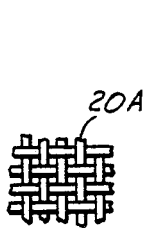
FIG. 3B depicts a close-up view of the inner lacing that occurs in FIG. 3.

With reference now to FIG. 1A, FIG. 1A depicts a perspective view of a prior art, cross-coil, air-core gauge 1. Gauge 1 includes an X or cosine winding 3, a Y or sine winding 4 wherein the cosine winding winds about a bobbin 8 in a first direction and the sine winding winds about the bobbin and over top of the cosine winding at right angles in a second direction. A shaft 5 routes through a shaft sleeve 5 and holds at one end a hub of a dial pointer 2 which moves about a dial face 9 and holds at the other end and within the cavity of the bobbin a permanent magnet rotor 7.

This form of air-core gauge has replaced the d'Arsonval movements, which were the standard for analog meters for along period of time in the auto industry. This is so because the air-core movement is more rugged than the d'Arsonval movement. Air-core gauges have enough torque applied to the rotor so that a rugged through-shaft sleeve may act as a bearing arrangement as opposed to employing jeweled bearings.

Most commonly such devices include two coils positioned at right angles to each other and energized in such a way that the magnetic fields produced by one coil increases while the other decreases in response to a changing signal from a remote energizing source until one coil is providing a maximum field in one direction and the other a minimum field in the other direction. The magnetized rotor 7 rotatably mounts in magnetic proximity to the deflection coils and attaches to the dial pointer 2 which angularly moves over the dial face 9 to indicate changing magnetic field conditions. The excitation applied to the coils is effective to rotate the resultant electro-magnetic field produced by the sum of the individual coil fields such as to cause the magnetized rotor 7 to rotate into alignment with the field.

FIGS. 1B and 1C depict the magnetic fields for the X coil and Y coil and FIG. 1D depicts the resultant field, i.e., the sum of the X and Y fields. The X winding and Y winding produce magnetic fields in a given direction and strength along their axis depending on the direction and magnitude of the current through the windings. These individual magnetic fields combine to produce the resultant field which is used to align the magnetic core accordingly and thereby to position the pointer.

Since one coil is closer to the rotor than the other, errors develop between the desired position of the pointer and the actual position of the pointer due to the unbalanced X and Y fields. In FIG. 1B, the X or outer coil produces a magnetic field pattern of a lesser intensity than that shown in FIG. 1C of the Y axis which is closer to the rotor 7. Hence, with the unbalanced magnetic fields of the X and Y coils, rotor 7 is caused to align itself with the resultant field similar to the one depicted in FIG. 1D. This resultant field presents a slightly distorted pattern which interferes with positioning the dial pointer to the desired position.

Referring now to FIG. 1E, there is shown a dial face 9 divided into four quadrants and the pointer 2 positioned in a desired position location. However, due to the magnitude of the currents in the X and Y windings, the actual positions of the pointer PA1 or PA2 will be offset from the desired position PD.

FIG. 1F depicts a plot of the observed operation of the dial pointer for the prior art device of FIG. 1A as it moves through quadrants 1 through 4. You will note that the unbalanced resulting errors cause great distortions in the balance between the + and − errors in each quadrant of dial 9.

The Air-Core Gauge of the Present Invention

Figure 3A:
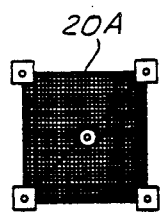
FIG. 3A depicts the interlacing of the X directed and Y directed windings about the shaft axis of the present air-core gauge.
Figure 2:
FIG. 2 depicts the woven cross-coil air-core gauge of the present invention.

FIG. 2 depicts a woven coil gauge of the present invention. There, the X and Y windings of coils 13 and 14 respectively are woven about bobbin 8 so as to generate an average radius of both coils that is substantially equal. The shaft 15 of dial pointer 12 extends through the through-sleeve 16 as in the prior art unit. However, the top plane 20A of the cross-coils and the bottom plane 20B provide a pattern as illustrated in FIG. 3A. A microscopic view of this interlacing of the winding for the coil is depicted in the FIG. 3B. The side planes of the coils are not interlaced.

Figure 3C:
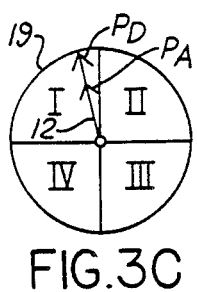
FIG. 3C depicts a dial face and pointer for the air-core gauge of the present invention showing that the actual position of the pointer is coincident with the desired position of the pointer.
Figure 4A:
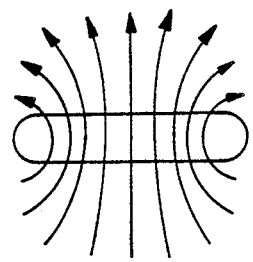
Figure 4B:
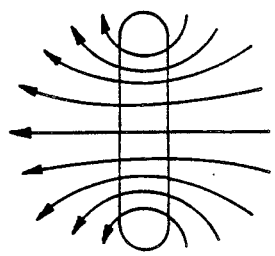
Figure 4C:
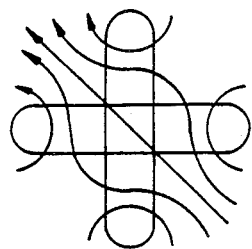
FIG. 4C depicts the resultant fields of the two fields of FIGS. 4A and 4B.

This structure of the X and Y coils produces magnetic field patterns as depicted in FIGS. 4A and 4B respectively. FIG. 4C depicts the resultant of both fields which provides a balance field for interacting with the magnetic field of the magnetized rotor. The rotor for the present invention is similar in shape to that shown in FIG. 1A labeled as rotor 7 in the prior art except that it is smaller in size in order to form a more compact gauge. Having balanced resultant electro-magnetic fields through all regions of each quadrant, the desired position of the needle will be in coincident with the actual position of the needle as depicted in FIG. 3C for an indefinite number of orientations of the rotor.

Figure 5:
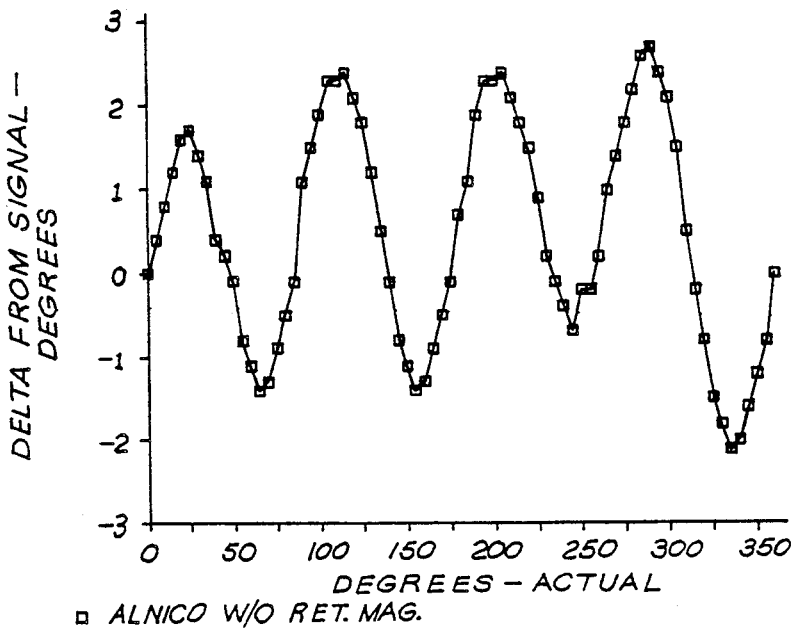
FIG. 5 depicts a plot of deflection errors for the woven balanced field air-core gauges.

With reference now to FIG. 5, this plot depicts the deflection error for the balanced field woven coil gauge which you may note is symmetrical about the 0 axis; hence, + and − readings are substantially equal. This means that the inherent errors of the instrument virtually cancel one another.

A Second Embodiment

Figure 6:
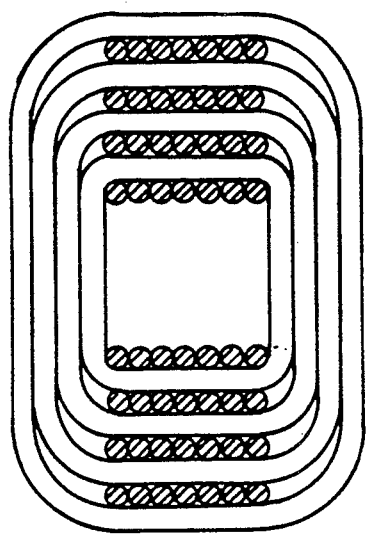
FIG. 6 depicts a second embodiment that has layered windings.

FIG. 6 depicts a second embodiment of the present invention wherein rather than having the windings interlaced, a first layer of X windings are wound then a layer of Y windings are wound over top of it. These layers of windings are alternately laid to form a cross-coil gauge having substantially equal radii for the X and Y coils. Hence, the resultant magnetic fields will again be a balanced field and the actual position (PA) of dial pointer 12 will coincide with the desired position (PD).

TABLE I

| Prior Art | Air-Core Gauge Outside Coil Cos X Coil | Characteristics Inside Coil Sin Y Coil |
| --- | --- | --- |
| Length | 1.290 cm | 1.290 cm |
| Mean Diameter | 2.1 cm | 0.65 cm |
| Mean Radius | 1.05 cm | 0.8125 cm |
| Current @ 12 v | 0.056 amp | 0.053 amp |
| Resistance | 212 ohms | 225 ohms |
| Flux Density | 105.45 line/cm$^2$ | 87.725 lines/cm$^2$ |
| Number of Turns | 1900 | 1700 |

Height of Gauge: 2.3 cm
Width of Gauge: 2.642 cm
Rotor: 11.86 mm diameter; 4.32 mm thick

TABLE II

| Woven Coil Air-Core Gauge Characteristics | | |
| --- | --- | --- |
| | Cos X Coil | Sin Y Coil |
| Length | 1.290 cm | 1.29 cm |
| Mean Diameter | 1.642 cm | 1.642 cm |
| Mean Radius | .821 cm | .821 cm |
| Current @ 12 v | .057 amp | .057 amp |
| Resistance | 218 ohms | 218 ohms |
| Flux Density | 87.725 lines/cm$^2$ | 87.725 lines/cm$^2$ |
| Number of Turns | 1800 | 1800 |

Height of Gauge: 1.79 cm
Width of Gauge: 2.02 cm
Rotor: 11.86 mm diameter; 4.32 mm thick Looking particularly at features of the air-core gauge, Table I presents characteristics of the prior art, cross-coil gauge depicted in FIG. 1A. While Table II presents characteristics of the woven cross-coil air-core gauge of the present invention depicted in FIG. 2.

Note that the woven coil gauge uses a single size or gauge, length and resistance of wire for both the X and Y coils in contrast with two different size, length and resistance of wire used in the prior art cross-coil gauge.

Also, note that the flux density is equal in both X and Y coils of the woven coil gauge while the prior art gauge coils provide two different numbers of flux lines per centimeter square. Even the overall size of the woven coil gauge is smaller.

I claim:

1. A cross-coil induction type air-core gauge for measuring electrical signals representing changes in magnitude of a measurand, said gauge comprising:
   (a) a dial face having calibrated graduations thereon for designating values equivalent to the changes in magnitude of the measured, said dial face comprising four equal quadrants;
   (b) a dial face pointer pivotally mounted about a pivot point and movable over said dial face for pointing to the calibrated graduations equivalent to the change in magnitude of the measurand;
   (c) coil bobbin means disposed below said dial face for providing an environment for containing and concentrating electromagnetic flux lines within a cavity substantially within a central region of said bobbin means, said bobbin means having a frame structure formed from a non-magnetic material;

(d) a rotatable shaft means connected at one end to the pivot point of said dial pointer and having another end extending into the central region of said bobbin means, said shaft means having a through-shaft sleeve means alone said shaft means disposed near a top region of said bobbin means within which said shaft means rotate;

(e) permanent magnet rotor means disposed in the cavity of said bobbin means having a north and a south magnetic pole shaped equally apart about a central axis region, said central axis region being fixedly attached to the other end of said shaft means for establishing a permanent magnet flux field within the cavity of said bobbin means and for rotating said shaft means in response to magnetic field influences upon the permanent magnet flux field;

(f) first and second stator coils woven orthogonally about said bobbin means so as to be physically interchangeable and so as to generate interchangeable electromagnetic fields within the cavity of said bobbin means, wherein lengths of wire of said first stator coil are interwoven with lengths of said second stator coil in a manner that the radius of said first stator coil equals the radius of said second stator coil, said coils responding to electrical excitation commands in a manner that permit moving a resultant electromagnetic field of said first and second stator coils about said shaft means so as to cause the field of the permanent magnet rotor to align in the direction of the resultant fields which, in turn, causes said pointer to move about said dial face to graduations directly proportional to the changes in magnitude of the measurand.

2. Gauge of claim 1 wherein said lengths of wire of said first stator coil are interwoven at right angles with said lengths of wire of said second stator coil.

3. Gauge of claim 2 wherein said first and second stator coils have substantially the same coil resistance, length, radius and wire size, and wherein maximum flux fields can occur in each coil in each quadrant of said dial and wherein current reversal in each coil permits moving the pointer across each interface of adjacent quadrants.

4. Gauge of claim 3 where at locations where a first stator coil winding crosses a second stator coil winding, said lengths of wire of said first coil winding are interwoven with said lengths of wire of said second coil winding to form a woven structure substantially opposite and parallel to said first woven structure.

5. Gauge of claim 4 wherein said both length and width of said gauge, excluding said dial face and said pointer, is substantially equivalent to a length of said first or second stator coil whereby a compact gauge results.

6. Gauge of claim 5 wherein said first and said second stator coils respond to generate substantially equal flux intensity from substantially equal electrical current excitation and to generate substantially equally complementary fields when said coils are excited with complementary magnitude and direction current signals.

7. Gauge of claim 5 wherein said substantially proportional advancing and declining needle position errors are symmetrical about a mid-position middle reference point in each quadrant of said dial face.

8. Gauge of claim 1 wherein the dial face has a minimum position and graduations extending linearly across the four quadrants to a maximum position.

* * * * *